(12) United States Patent
Kuramoto (10) Patent No.: US 7,755,101 B2
(45) Date of Patent: Jul. 13, 2010

(54) SEMICONDUCTOR LIGHT EMITTING DEVICE

(75) Inventor: Kyosuke Kuramoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 22 days.

(21) Appl. No.: 11/910,792

(22) PCT Filed: Mar. 17, 2006

(86) PCT No.: PCT/JP2006/305367

§ 371 (c)(1),
(2), (4) Date: Oct. 5, 2007

(87) PCT Pub. No.: WO2006/109418

PCT Pub. Date: Oct. 19, 2006

(65) Prior Publication Data

US 2009/0026489 A1    Jan. 29, 2009

(30) Foreign Application Priority Data

Apr. 11, 2005    (JP) .............................. 2005-113365

(51) Int. Cl.
*H01L 21/74* (2006.01)

(52) U.S. Cl. ................................ 257/103; 257/E33.001
(58) Field of Classification Search .................. 257/103, 257/E33.001
See application file for complete search history.

(56) References Cited

U.S. PATENT DOCUMENTS

| | | | |
|---|---|---|---|
| 6,229,150 B1 * | 5/2001 | Takayama et al. | 257/12 |
| 6,555,403 B1 | 4/2003 | Domen et al. | |
| 6,580,736 B1 | 6/2003 | Yoshie et al. | |
| 6,614,059 B1 | 9/2003 | Tsujimura et al. | |
| 2002/0044583 A1 * | 4/2002 | Samonji et al. | 372/46 |

FOREIGN PATENT DOCUMENTS

| | | |
|---|---|---|
| JP | 7-235725 | 9/1995 |
| JP | 10-145004 | 5/1998 |
| JP | 11-074607 | 3/1999 |
| JP | 11-340580 | 12/1999 |
| JP | 2000-91705 | 3/2000 |
| JP | 2000-91708 | 3/2000 |
| JP | 2000-261106 | 9/2000 |
| JP | 2000-277855 | 10/2000 |
| JP | 2004-311658 | 11/2004 |

* cited by examiner

*Primary Examiner*—Thao X Le
*Assistant Examiner*—Elias Ullah
(74) *Attorney, Agent, or Firm*—Leydig, Voit & Mayer, Ltd.

(57) ABSTRACT

A semiconductor light emitting device has an active layer of a gallium nitride compound semiconductor material, a first semiconductor layer of $In_{x1}Al_{y1}Ga_{1-x1-y1}N$ ($0 \leq x1 \leq 1$, $0 \leq y1 \leq 1$), on a p-layer side of the active layer, and which is subjected to tensile strain, a second semiconductor layer of $In_{x2}Al_{y2}Ga_{1-x2-y2}N$, wherein ($0 \leq x2 \leq 1$, $0 \leq y2 \leq 1$), and which has a bandgap energy smaller than the bandgap energy of the first semiconductor layer, and a third semiconductor layer between the first semiconductor layer and the second semiconductor layer, of $In_{x3}Al_{y3}Ga_{1-x3-y3}N$, wherein ($0 \leq x3 \leq 1$, $0 \leq y3 \leq 1$), and which has a bandgap energy smaller than the bandgap energy of the first semiconductor layer and larger than the bandgap energy of the second semiconductor layer.

12 Claims, 9 Drawing Sheets

SEMICONDUCTOR LIGHT EMITTING DEVICE

TECHNICAL FIELD

The present invention relates to a semiconductor laser or a light emitting diode using a III-V group nitride compound semiconductor.

BACKGROUND ART

In recent years, semiconductor lasers using a III-V group nitride compound semiconductor such as AlInGaN have been actively studied, developed and put to practical use as a semiconductor laser capable of light emission from a blue region to an ultraviolet region necessary for improving the density of optical disks, in place of conventional GaAs semiconductor lasers (see, Patent Document 1).

In such semiconductor lasers, an electron barrier layer having a bandgap larger than that of an active layer is inserted on the p-electrode side of the active layer to prevent an overflow of electrons from the active layer and hence a reduction in light emission efficiency. A p-type AlGaN or AlInGaN material is used as this electron barrier layer. If the Al composition ratio is higher, a bandgap is larger and the effect of restricting an overflow of electrons is increased. However, if the Al composition ratio is excessively high, the crystallinity is degraded to reduce the light emission efficiency instead of restricting the reduction in light emission efficiency. Therefore the Al composition ratio in the electron barrier layer is determined by considering this advantage and disadvantage. Also, if the thickness of the electron barrier layer is larger, the effect of restricting an overflow of electrons is increased. However, an adverse effect of degrading the crystallinity is produced in such a case. The layer thickness is determined by considering this advantage and disadvantage.

Figure 6:
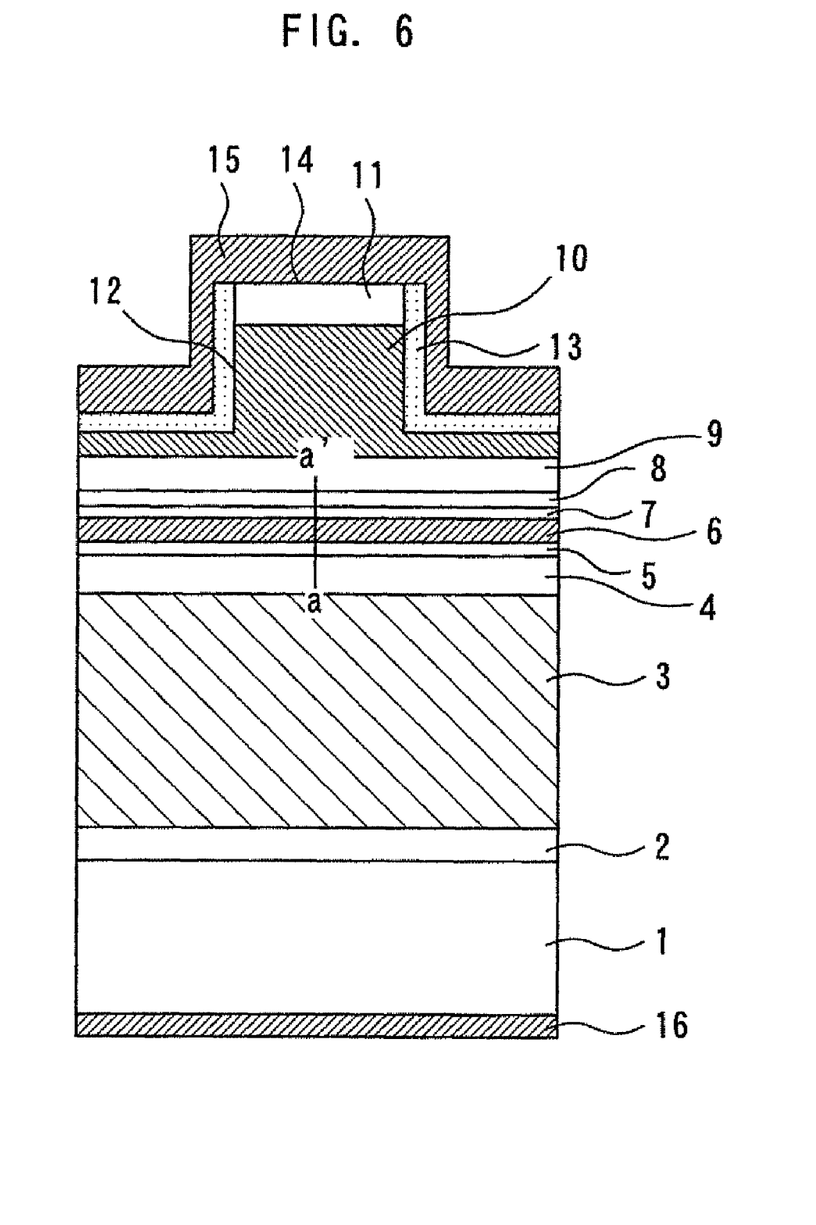
FIG. 6 is a sectional view of a conventional semiconductor light emitting device.

On the other hand, if the electron barrier layer has a thickness large enough to sufficiently restrict an overflow of electrons, it is advantageous, from the viewpoint of crystallinity, to reduce the Al composition ratio in a light guide layer and a clad layer on the p-electrode side of the electron barrier layer relative to that in the electron barrier layer. For this reason, the light guide layer and the p-type clad layer are formed of AlGaN, GaN or InGaN having an Al composition ratio lower than that in the electron barrier layer. FIG. 6 is a sectional view of a conventional semiconductor light emitting device having such a structure.

As shown in FIG. 6, an n-type buffer layer 2 formed of GaN and having a thickness of 1.0 μm, an n-type clad layer 3 formed of AlGaN and having a thickness of 1.0 μm and Al composition ratio of 0.07, an n-type light guide layer 4 formed of GaN and having a thickness of 100 nm, an optical waveguide layer 5 formed of undoped InGaN and having a thickness of 7 nm, an active layer 6, an optical waveguide layer 7 formed of undoped InGaN and having a thickness of 20 nm and an In composition ratio of 0.02, an electron barrier layer 8 formed of p-type AlGaN and having a thickness of 20 nm and an Al composition ratio of 0.2, a p-type light guide layer 9 formed of p-type GaN and having a thickness of 100 nm, a p-type clad layer 10 formed of AlGaN and having a thickness of 400 nm and an Al composition ratio of 0.07 and a p-type contact layer 11 formed of GaN and having a thickness of 100 nm are successively formed in this order from the bottom on a GaN substrate 1.

The active layer 6 is a multiple quantum well structure in which three undoped InGaN well layers each having a thickness of 3.5 nm and an In composition ratio of 0.14 and two undoped InGaN barrier layers each having a thickness of 7.0 nm and an In composition ratio of 0.02 are alternately stacked. In the p-type clad layer 10 and the p-type contact layer 11, a ridge 12 is formed in the <1100> orientation by etching. The width of the ridge 12 is 1.5 μm and the etching depth is 450 nm. An SiO$_2$ insulating film 13 having a thickness of 200 nm is formed so as to cover side surface portions of the ridge 12 and the upper surface of the p-type clad layer 10. An opening 14 is provided in the insulating film 13 above the ridge 12. A p-type electrode 15 electrically contacts the p-type contact layer 11 through the opening 14. The p-type electrode 15 is provided, for example, by successively stacking Pd and Au films. An n-type electrode 16 is provided on the back surface of the GaN substrate 1 by successively stacking Ti and Al films.

Patent Document 1: Japanese Patent Laid-Open No. 7-235725

DISCLOSURE OF THE INVENTION

Problem to be Solved by the Invention

When an InGaN layer and an AlGaN layer are grown on a GaN substrate or a base layer having a lattice constant close to that of GaN, the InGaN layer receives compression strain in a direction in the growth plane while the AlGaN layer receives tensile strain. Since these layers have a wurtzite structure, a piezoelectric field is generated in the crystal growth direction in each layer by the piezoelectric effect due to this strain. The directions of strain in the InGaN layer and the AlGaN layer are different from each other. Therefore the directions of the generated piezoelectric fields are different from each other.

Figure 7:
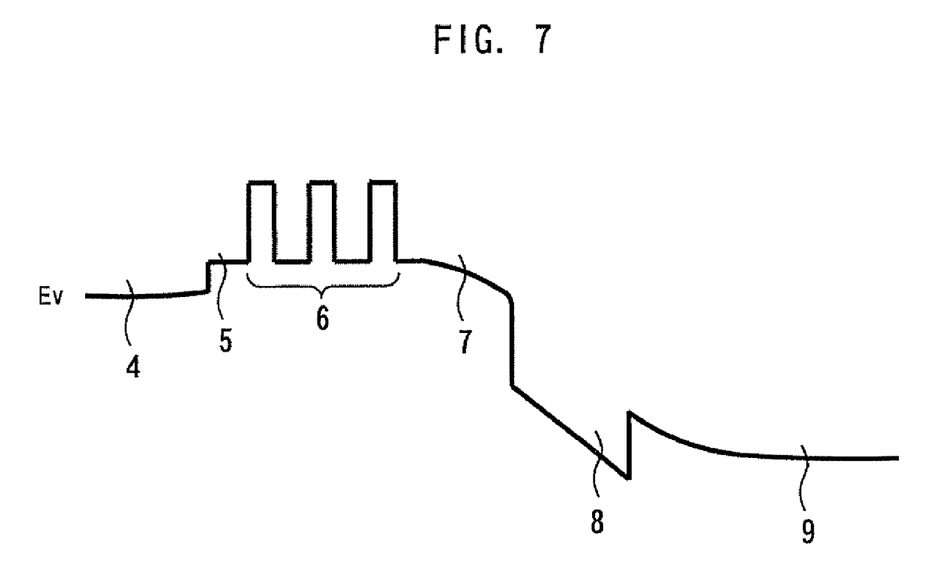
FIG. 7 is a diagram showing the valence electron band structure of the conventional semiconductor light emitting device in a case where the piezoelectric effect is not considered.
Figure 8:
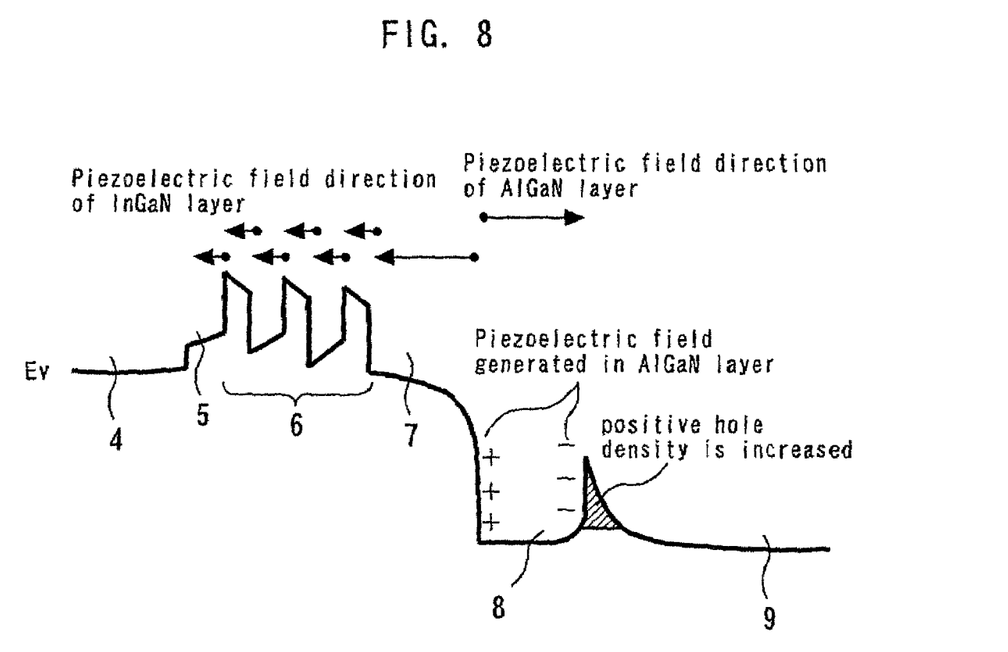
FIG. 8 is a diagram showing the valence electron band structure of the conventional semiconductor light emitting device in a case where the piezoelectric effect is considered.

FIGS. 7 and 8 show the results of a simulation of the valence electron band structure corresponding to an a-a' portion in FIG. 6 with respect to a case where the piezoelectric effect is not considered and a case where the piezoelectric effect is considered. In FIG. 8, the direction of the piezoelectric field is indicated by an arrow. In the electron barrier layer 8, positive charge indicated by a symbol "+" is generated on the optical waveguide layer 7 side by the piezoelectric effect, while negative charge indicated by a symbol "−" is generated on the p-type light guide layer 9 side by the piezoelectric field. A piezoelectric field is generated thereby. A large band bend is caused in the vicinity of the interface between the electron barrier layer 8 and the p-type light guide layer 9 to largely increase the positive hole density. When the carrier density is increased as described above, the resistance is reduced to cause the existence of a low-resistance layer above the active layer 6 in a direction in the plane perpendicular to the crystallographic orientation. The same piezoelectric effect is also produced in the InAlGaN layer. However, the direction of the piezoelectric field thereby produced is determined by the direction of strain received by the material.

Figure 9:
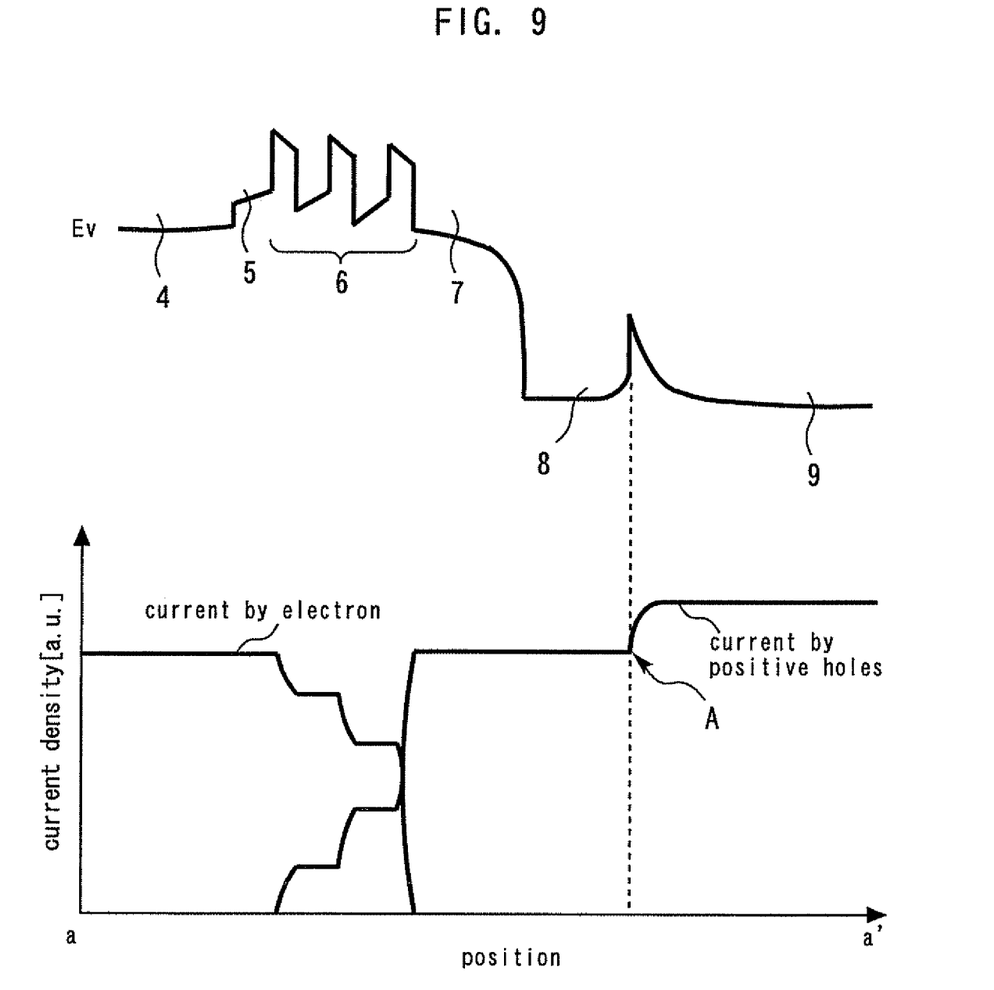
FIG. 9 is a diagram showing the results of a simulation of current density in the case shown in FIG. 8.

FIG. 9 shows the results of a simulation of the current density in the case shown in FIG. 8. A current by positive holes and a current by electrons are separately illustrated. It can be understood therefrom that the current density of the current by positive holes is largely reduced at point A between the electron barrier layer 8 and the p-type light guide layer 9. A band bend is caused by the above-described piezoelectric field at the point A to largely spread the current laterally, thereby reducing the current density.

If an electron barrier layer is provided in a light emitting device in which a current is injected only into a partial p-side region as in the ridge-type structure shown in FIG. 6, positive holes injected from the p-electrode are largely spread laterally in the above-described low-resistance region. Therefore the positive holes are injected into the active layer while also being laterally spread, so that the current density in the active layer is reduced and a light emission characteristic is largely degraded.

The above-described conventional art is only an example. A similar problem also occurs in a case where an electron barrier layer is not AlGaN but $In_{x1}Al_{y1}Ga_{1-x1-y1}N$ ($0 \leq x1 \leq 1$, $0 \leq y1 \leq 1$) which receives tensile strain and in a case where a light guide layer is not GaN but $In_{x2}Al_{y2}Ga_{1-x2-y2}N$ ($0 \leq x2 \leq 1$, $0 \leq y2 \leq 1$) having a bandgap smaller than that of an electron barrier layer. That is, the above-described problem is due to the fact that the III-V group nitride compound semiconductor is a material which produces the piezoelectric effect as a special effect.

The present invention has been achieved to solve the above-described problem, and an object of the present invention is to obtain a semiconductor light emitting device capable of improving light emission characteristics.

ADVANTAGES OF THE INVENTION

According to the present invention, a band bend between a first semiconductor layer which is formed of $In_{x1}Al_{y1}Ga_{1-x1-y1}N$ ($0 \leq x1 \leq 1$, $0 \leq y1 \leq 1$) and which receives tensile strain and a second semiconductor layer which is formed of $In_{x2}Al_{y2}Ga_{1-x2-y2}N$ ($0 \leq x2 \leq 1$, $0 \leq y2 \leq 1$) and which has a bandgap smaller than that of the first semiconductor layer can be reduced to restrict the generation of positive holes at a high density at this position and to thereby limit lateral current spreading, thus improving light emission characteristics.

BEST MODE FOR CARRYING OUT THE INVENTION

First Embodiment

Figure 1:
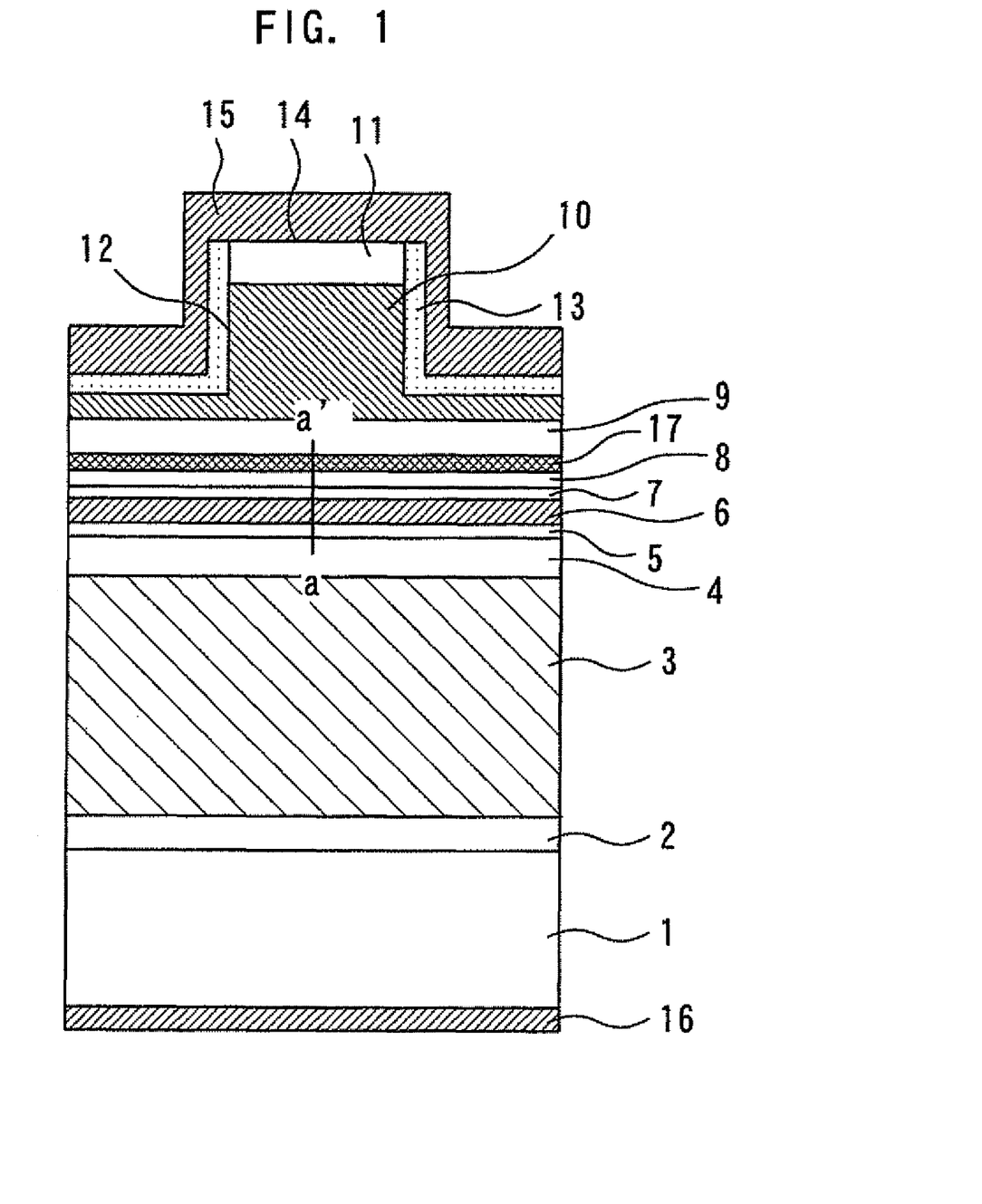
FIG. 1 is a sectional view of a semiconductor light emitting device according to First Embodiment of the present invention.

First Embodiment of the present invention will be described with reference to the drawings. FIG. 1 is a sectional view of a semiconductor light emitting device according to First Embodiment of the present invention. This semiconductor light emitting device is a nitride semiconductor laser having a ridged structure.

As shown in FIG. 1, an n-type buffer layer 2 formed of GaN and having a thickness of 1.0 µm, an n-type clad layer 3 formed of AlGaN and having a thickness of 1.0 µm and Al composition ratio of 0.07, an n-type light guide layer 4 formed of GaN and having a thickness of 100 nm, an optical waveguide layer 5 formed of undoped InGaN and having a thickness of 7 nm, an active layer 6, an optical waveguide layer 7 formed of undoped InGaN and having a thickness of 20 nm and an In composition ratio of 0.02, an electron barrier layer 8 formed of p-type AlGaN and having a thickness of 20 nm and an Al composition ratio of 0.2, an intermediate layer 17 formed of p-type InAlGaN, a p-type light guide layer 9 formed of p-type GaN and having a thickness of 100 nm, a p-type clad layer 10 formed of AlGaN and having a thickness of 400 nm and an Al composition ratio of 0.07 and a p-type contact layer 11 formed of GaN and having a thickness of 100 nm are successively formed in this order from the bottom on a GaN substrate 1.

The active layer 6 is a multiple quantum well structure in which three undoped InGaN well layers each having a thickness of 3.5 nm and an In composition ratio of 0.14 and two undoped InGaN barrier layers each having a thickness of 7.0 nm and an In composition ratio of 0.02 are alternately stacked. In the p-type clad layer 10 and the p-type contact layer 11, a ridge 12 is formed in the <1100> orientation by etching. The width of the ridge 12 is 1.5 µm and the etching depth is 450 nm. An $SiO_2$ insulating film 13 having a thickness of 200 nm is formed so as to cover side surface portions of the ridge 12 and the upper surface of the p-type clad layer 10. An opening 14 is provided in the insulating film 13 above the ridge 12. A p-type electrode 15 electrically contacts the p-type contact layer 11 through the opening 14. The p-type electrode 15 is provided, for example, by successively stacking Pd and Au films. An n-type electrode 16 is provided on the back surface of the GaN substrate 1 by successively stacking Ti and Al films.

A method of manufacturing the semiconductor light emitting device according to First Embodiment will be described. On GaN substrate 1 having its surface cleaned in advance by thermal cleaning or the like, n-type buffer layer 2 is grown at a growth temperature of, for example, 1000° C. by a metal organic chemical vapor deposition (MOCVD) method. Subsequently, n-type clad layer 3, n-type light guide layer 4, optical waveguide layer 5, active layer 6, optical waveguide layer 7, electron barrier layer 8, intermediate layer 17, p-type light guide layer 9, p-type clad layer 10 and p-type contact layer 11 are also formed successively by the MOCVD method. The temperatures at which these layers are grown are, for example, a temperature of 1000° C. at which n-type clad layer 3 and n-type light guide layer 4 are grown, a temperature of 740° C. at which the layers from undoped InGaN optical waveguide layer 5 to undoped InGaN optical waveguide layer 7 are grown, and a temperature of 1000° C. at which the layers from electron barrier layer 8 to p-type contact layer 11 are grown.

A resist is applied to the entire substrate surface after the completion of the above-described crystal growth, and a resist pattern having a predetermined shape corresponding to the shape of the mesa portion is formed by lithography. Etching to an internal portion of p-type clad layer 10 is performed, for example, by a RIE method, with this resist pattern used as a mask. Ridge 12 is formed as an optical waveguide structure by this etching. Chlorine based gas for example is used as etching gas.

Insulating film 13 formed of $SiO_2$ and having a thickness of 0.2 μm is formed on the entire surface, for example, by a CVD method, a vacuum deposition method or a sputtering method without removing the resist pattern. Thereafter, a lift-off step in which the insulating film 13 on ridge 12 is removed simultaneously with removal of the resist is performed. Opening 14 is thereby formed on ridge 12.

Subsequently, Pt film and Au film are successively formed on the entire surface, for example, by a vacuum deposition method. Thereafter, surface p-type electrode 15 is formed by performing resist application, lithography and wet etching or dry etching. Thereafter, Ti film and Al film are successively formed on the entire back surface of the substrate by a vacuum deposition method, thereby forming an n-type electrode. Alloying for making an ohmic contact on n-type electrode 16 is thereafter performed.

Subsequently, the wafer is worked into a bar form by cleavage or the like to form resonator end surfaces. Further, an end surface coating is formed on the resonator end surfaces, and the bar is formed into a chip by cleavage or the like. The semiconductor light emitting device according to First Embodiment is thus manufactured.

In the semiconductor light emitting device according to First Embodiment, an intermediate layer 17 is provided between the electron barrier layer 8 and the p-type light guide layer 9. This intermediate layer 17 has a thickness of 10 nm, an In composition ratio of 0.04, an Al composition ratio of 0.18 and a Ga composition ratio of 0.78 and is substantially strain-free because it is lattice-matched to the GaN substrate 1. The semiconductor light emitting device according to First Embodiment has a threshold value of 37 mA and a differential efficiency of 1.42 W/A. The corresponding characteristics of the conventional semiconductor light emitting device are 45 mA and 1.35 W/A. Thus, the light emission characteristics are improved.

Figure 2:
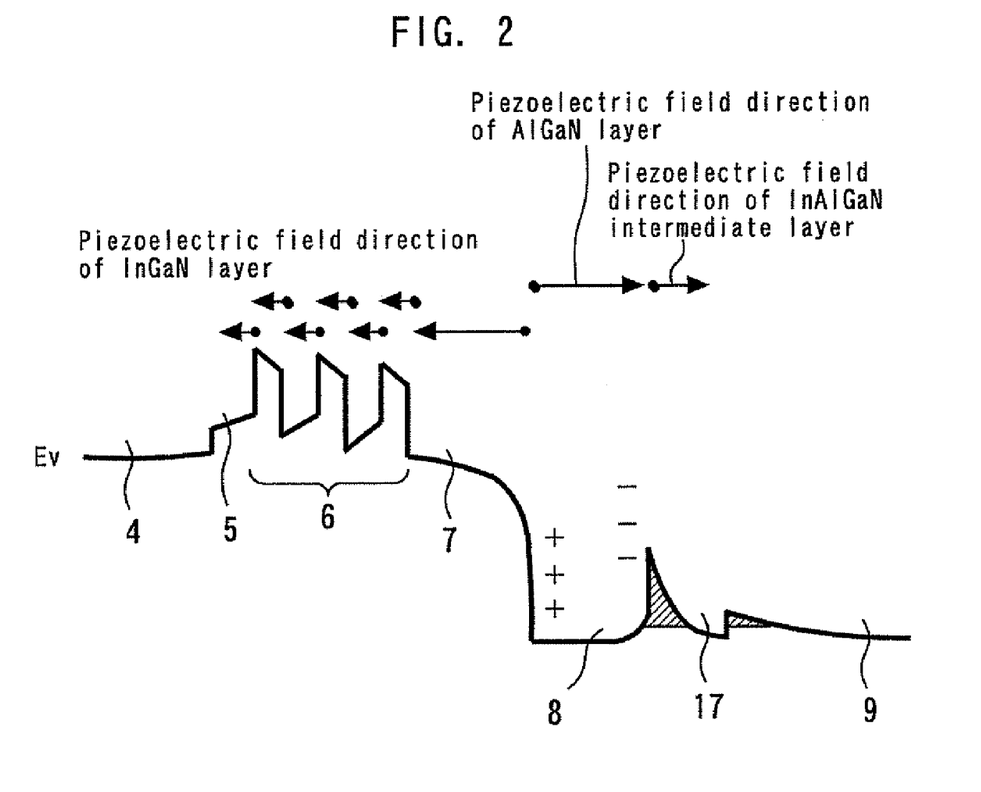
FIG. 2 is a diagram showing the valence electron band structure of the semiconductor light emitting device according to First Embodiment of the present invention.

FIG. 2 shows the results of a simulation of the valence electron band structure corresponding to an a-a' portion in FIG. 1. As shown in the figure, a band bend is caused at each of the interface between the electron barrier layer 8 and the intermediate layer 17 and the interface between the intermediate layer 17 and the p-type light guide layer 9. The amounts of band discontinuity at these band bends are smaller than that in the conventional structure, and the densities of positive holes generated at the interfaces are considerably low. Two high-hole-density portions therefore appear, but the density of positive holes in each portion is low. As a result, the reduction in the resistance value as a whole can be limited.

Figure 3:
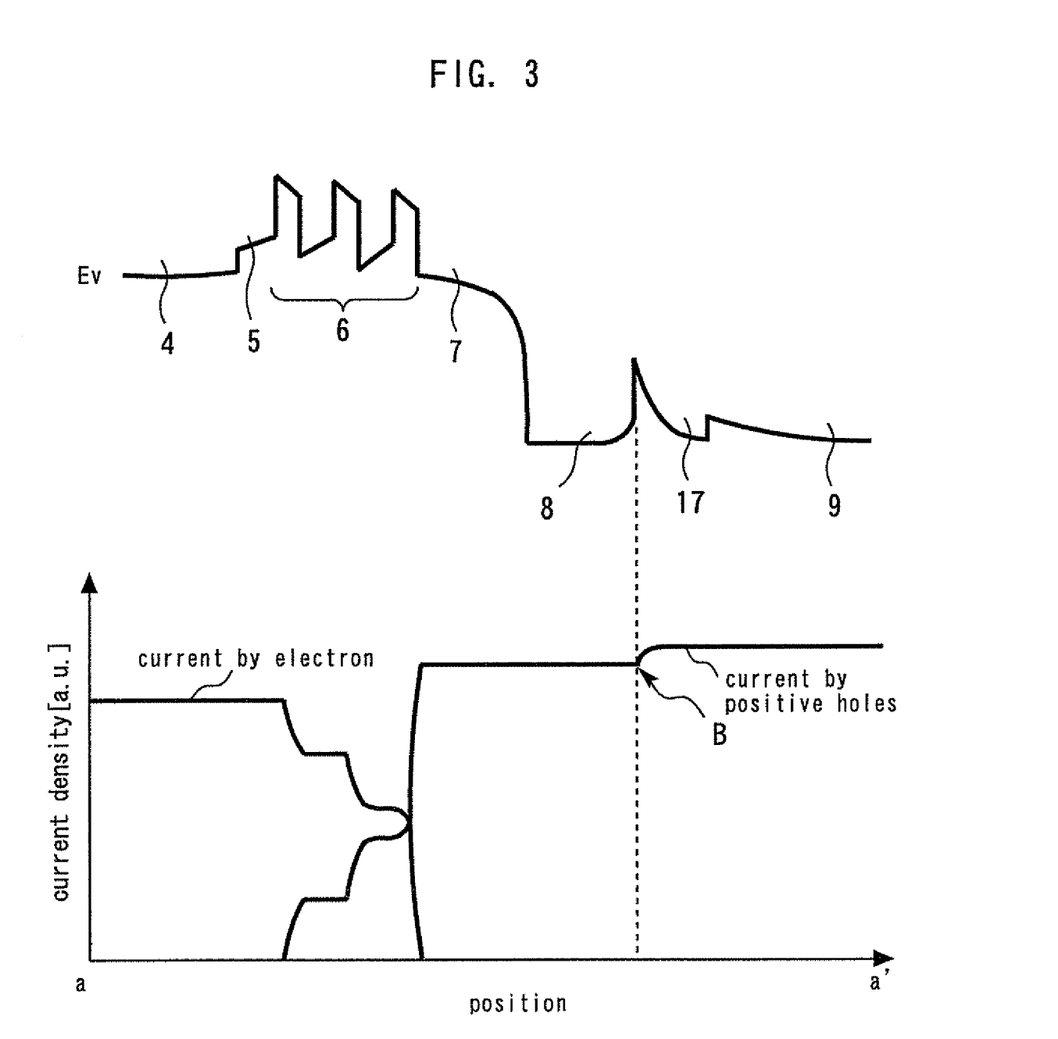
FIG. 3 is a diagram showing the results of a simulation of current density in the case shown in FIG. 2.

FIG. 3 shows the results of a simulation of current density in the case shown in FIG. 2. The reduction in current density at point B between the electron barrier layer 8 and the intermediate layer 17 shown in FIG. 3 is smaller than the reduction in current density at point A shown in FIG. 9. Thus, the structure according to First Embodiment is capable of limiting lateral current spreading and ensures improvements in the light emission characteristics.

Any semiconductor light emitting device other than the above-described example can have the same advantage, if it has an active layer formed of a gallium nitride compound semiconductor, a first semiconductor layer which is formed of $In_{x1}Al_{y1}Ga_{1-x1-y1}N$ ($0 \leq x1 \leq 1$, $0 \leq y1 \leq 1$), which is provided on the p-layer side of the active layer, and which receives tensile strain, a second semiconductor layer which is formed of $In_{x2}Al_{y2}Ga_{1-x2-y2}N$ ($0 \leq x2 \leq 1$, $0 \leq y2 \leq 1$), and which has a bandgap smaller than that of the first semiconductor layer, and a third semiconductor layer which is provided between the first semiconductor layer and the second semiconductor layer, which is formed of $In_{x3}Al_{y3}Ga_{1-x3-y3}N$ ($0 \leq x3 \leq 1$, $0 \leq y3 \leq 1$), and which has a bandgap smaller than that of the first semiconductor layer and larger than that of the second semiconductor layer. However, it is preferred that $0 < y2 < y3 < y1 \leq 1$.

In a case where the first semiconductor layer is formed of $Al_{y1}Ga_{1-y1}N$ ($y1 \geq 0.15$) and where the second semiconductor layer is formed of $In_{x2}Ga_{1-x2}N$ ($x2 \geq 0$), the piezoelectric effect is markedly high and the above-described problem is serious. Therefore the present invention is highly advantageous in such a case.

If, in a case where the first semiconductor layer is formed of $Al_{y1}Ga_{1-y1}N$ and where the second semiconductor layer is also formed of $Al_{y2}Ga_{1-y2}N$, the Al composition difference y1−y2 is larger than 0.15, the piezoelectric effect is markedly high and the above-described problem is serious. Therefore the present invention is highly advantageous in such a case.

If, in a case where the first semiconductor layer is formed of $Al_{y1}Ga_{1-y1}N$; the second semiconductor layer is formed of $Al_{y2}Ga_{1-y2}N$; and the third semiconductor layer is formed of $Al_{y3}Ga_{1-y3}N$, y3 is larger than $\{(y1+y2)/2\} \times 0.7$ and smaller than $\{(y1+y2)/2\} \times 1.3$, both the bandgap difference between the first semiconductor layer and the third semiconductor layer and the bandgap difference between the third semiconductor layer and the second semiconductor layer can be reduced to reduce the barrier to positive holes moving from the p-layer side to the active layer. The advantage of reducing the operating voltage can therefore be obtained in such a case.

The lattice constant of $In_xAl_yGa_{1-x-y}N$ ($0 \leq x \leq 1$, $0 \leq y \leq 1$) is substantially the same as that of the GaN substrate 1. Therefore the intermediate layer 17 may be made substantially large in thickness. However, the crystallinity of crystals containing In is generally not good. This is for the reason described below. There is a need to reduce the growth temperature because In cannot be easily taken into the crystal when the growth temperature is high. The crystallinity is degraded as a result of growth at a reduced temperature. Therefore the upper limit of the thickness of the intermediate layer 17 (third semiconductor layer) is determined by the crystallinity. The thickness of the intermediate layer 17 is 100 nm or less, preferably 50 nm or less, and more preferably 30 nm or less. If the layer thickness is smaller than 1 nm, substantially no effect of the intermediate layer is produced. Therefore it is necessary that the layer thickness be 1 nm or more.

Even in a case where there is no p-type light guide layer 9, the same effect can also be obtained if the intermediate layer 17 is provided between the electron barrier layer 8 and the p-type clad layer 10. The same effect can also be obtained in a case where a base layer having a lattice constant close to that of GaN, e.g., a low-temperature GaN buffer layer made on a substrate such as a sapphire substrate not lattice-matched to GaN or a GaN layer made on a substrate such as a sapphire substrate not lattice-matched to GaN by using a lateral selective growth technique is used in place of the GaN substrate.

Second Embodiment

A semiconductor light emitting device according to Second Embodiment has as intermediate layer 17 a p-type InAlGaN layer which has a thickness of 10 nm, an In composition ratio of 0.01, an Al composition ratio of 0.14 and a Ga composition ratio of 0.85, and which receives tensile strain. In other respects, the structure of this semiconductor light emitting device is the same as that in First Embodiment and the manufacturing method is also the same as that in First Embodiment.

The semiconductor light emitting device according to Second Embodiment has a threshold value of 30 mA and a differential efficiency of 1.52 W/A and is thus improved in comparison with the conventional semiconductor light emitting device.

Figure 4:
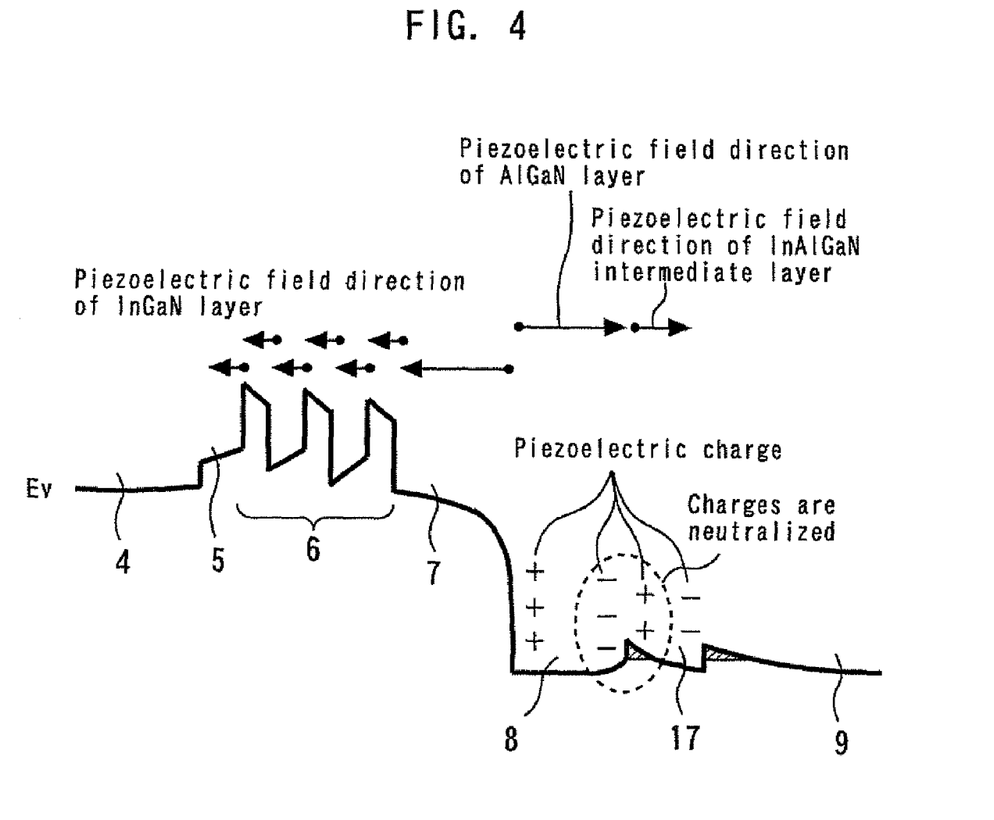
FIG. 4 is a diagram showing the valence electron band structure of a semiconductor light emitting device according to Second Embodiment of the present invention.

A layer having a lattice constant larger than that of the GaN substrate and receiving tensile strain may be used as intermediate layer 17, as described above. FIG. 4 shows a valence electron band structure in this case corresponding to the a-a' portion shown in FIG. 1. Positive charge and negative charge generated in the electron barrier layer 8 and the intermediate layer 17 by the piezoelectric effect are indicated by a symbol "+" and a symbol "−", respectively. Since each of the electron barrier layer 8 and the intermediate layer 17 receives tensile strain, positive charge and negative charge are simultaneously generated at the interface between these two layers to cancel out each other. Therefore, if the amount of strain in the intermediate layer 17 is set to a suitable value, the charge generated at the interface is extremely small and the band bend is also made small. Further, the amount of band discontinuity is also reduced, so that the positive hole density is extremely low. On the other hand, negative charge is newly generated at the interface between the intermediate layer 17 and the p-type light guide layer 9. However, this negative charge can be reduced by setting the amount of strain in the intermediate layer 17 to a suitable value.

In this way, the amount of band discontinuity can be reduced to set the positive hole density to an extremely low value at each of the interface between the electron barrier layer 8 and the intermediate layer 17 and the interface between the intermediate layer 17 and the p-type light guide layer 9. Two high-hole-density portions therefore appear, but the density of positive holes in each portion is low. As a result, the reduction in the resistance value as a whole can be limited.

Figure 5:
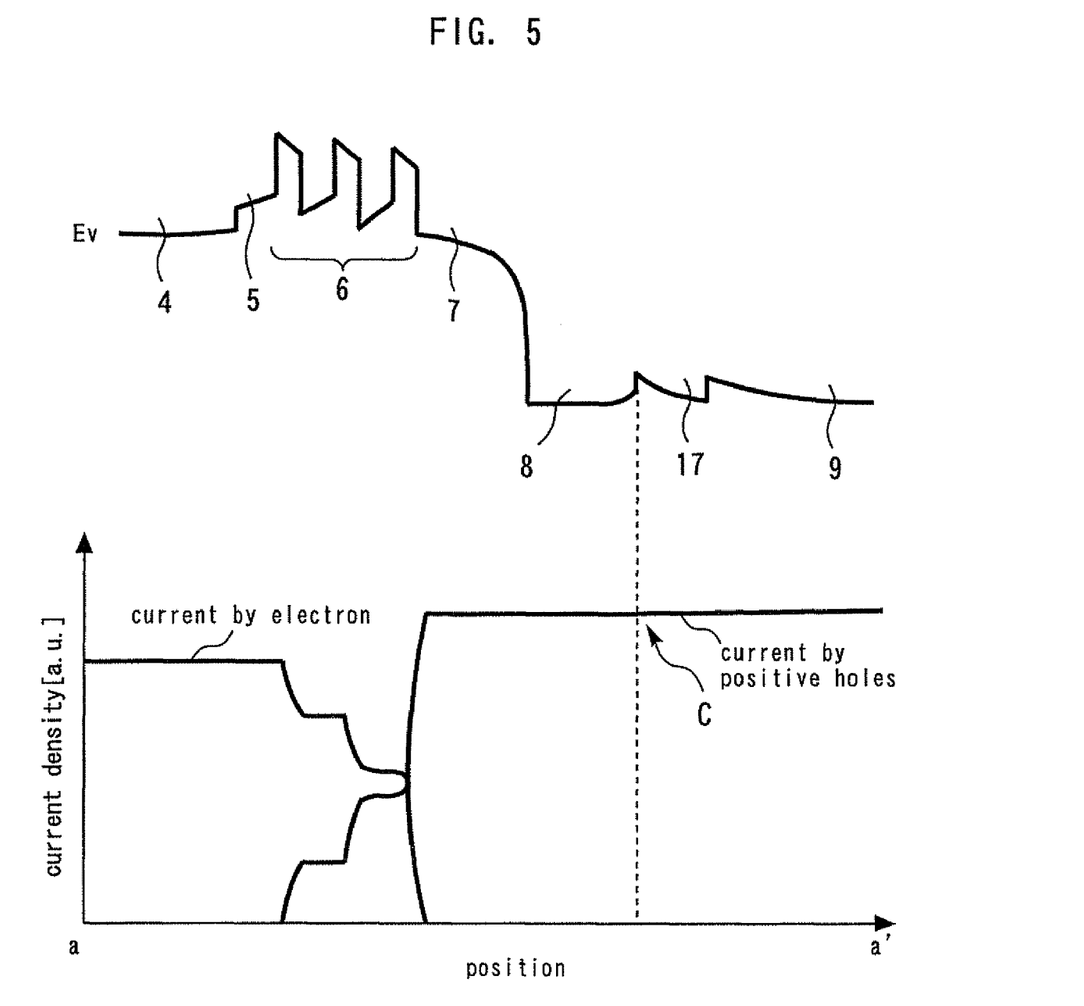
FIG. 5 is a diagram showing the results of a simulation of current density in the case shown in FIG. 4.

FIG. 5 shows the results of a simulation of current density in the case shown in FIG. 4. The reduction in current density at point C between the electron barrier layer 8 and the intermediate layer 17 shown in FIG. 5 is smaller than the reduction in current density at point A shown in FIG. 9 and the reduction in current density at point B shown in FIG. 3. Thus, in the above-described structure, the insertion of the intermediate layer 17 ensures a further improvement in the effect of limiting lateral current spreading.

Third Embodiment

A semiconductor light emitting device according to Third Embodiment has as intermediate layer 17 a p-type AlGaN layer having a thickness of 10 nm and an Al composition ratio of 0.2. In other respects, the structure of this semiconductor light emitting device is the same as that in First Embodiment and the manufacturing method is also the same as that in First Embodiment.

The semiconductor light emitting device according to Third Embodiment has a threshold value of 28 mA and a differential efficiency of 1.56 W/A and is thus improved in comparison with the conventional semiconductor light emitting device.

An AlGaN material may be used as intermediate layer 17, as described above. In a case where AlGaN material is formed on a GaN substrate or on a base layer having a lattice constant close to that of GaN, it necessarily receives tensile strain. Also, in a case where an AlGaN material is used as intermediate layer 17, the Al composition ratio may be made lower than that in the electron barrier layer 8 and larger than that in the p-type light guide layer 9 to make the bandgap of the intermediate layer 17 smaller than that of the electron barrier layer 8 and higher than that of the p-type light guide layer 9. Therefore an intermediate layer satisfying the above-described two conditions can be easily made.

INDUSTRIAL APPLICABILITY

The present invention ensures that a band bend at a portion between a first semiconductor layer which is formed of $In_{x1}Al_{y1}Ga_{1-x1-y1}N$ ($0 \leq x1 \leq 1$, $0 \leq y1 \leq 1$) and which receives tensile strain and a second semiconductor layer which is formed of $In_{x2}Al_{y2}Ga_{1-x2-y2}N$ ($0 \leq x2 \leq 1$, $0 \leq y2 \leq 1$) and which has a bandgap smaller than that of the first semiconductor layer can be reduced to limit the generation positive holes at a high density in this portion and to thereby restrict lateral current spreading, thus improving light emission characteristics.

What is claimed is:

1. A semiconductor light emitting device comprising:
   a substrate;
   a plurality of n-type semiconductor layers supported by the substrate;
   an active layer of a gallium nitride compound semiconductor material, the active layer being supported by the plurality of n-type semiconductor layers;
   a plurality of p-type semiconductor layers supported by the active layer, wherein the plurality of p-type semiconductor layers includes
      a p-type first semiconductor layer of $In_{x1}Al_{y1}Ga_{1-x1-y1}N$, wherein $X1=0$ and $y1=0.2$, having a first bandgap energy, and having an internal tensile strain,
      a p-type second semiconductor layer of $In_{x2}Al_{y2}Ga_{1-x2-y2}N$, wherein ($0 \leq x2 \leq 1$, $0 \leq y2 \leq 1$), and having a second bandgap energy, smaller than the first bandgap energy, and
      a p-type third semiconductor layer located between the first semiconductor layer and the second semiconductor layer, of $In_{x3}Al_{y3}Ga_{1-x3-y3}N$, wherein $x3=0.04$ and $y3=0.18$, and having a third bandgap energy smaller than the first bandgap energy and larger than the second bandgap energy, wherein the p-type second semiconductor layer is located farther from the active layer than is the p-type first semiconductor layer.

2. The semiconductor light emitting device according to claim 1, wherein $y2=0$.

3. The semiconductor light emitting device according to claim 1, wherein $y2 < 0.05 x2 = 0$, and $0.2 - y2 > 0.15$.

4. The semiconductor light emitting device according to claim 1, wherein the p-type third semiconductor layer has a thickness in a range from 1 nm to 100 nm.

5. The semiconductor light emitting device according to claim 1, wherein the p-type third semiconductor layer has a thickness in a range from 1 nm to 50 nm.

6. The semiconductor light emitting device according to claim 1, wherein the p-type third semiconductor layer has a thickness in a range from 1 nm to 30 nm.

7. A semiconductor light emitting device comprising:
   a GaN substrate;
   a plurality of n-type semiconductor layers of gallium nitride semiconductor materials supported by the GaN substrate;
   an active layer of a gallium nitride semiconductor material supported by the plurality of n-type semiconductor layers;
   a plurality of p-type semiconductor layers of gallium nitride semiconductor materials supported by the active layer, wherein the p-type semiconductor layers include a p-type first semiconductor layer of $In_{x1}Al_{y1}Ga_{1-x1-y1}N$, wherein $x1=0$ and $y1=0.2$, having a first bandgap energy, and having an internal tensile strain, a p-type second semiconductor layer of $In_{x2}Al_{y2}Ga_{1-x2-y2}N$, wherein ($0 \leq x2 \leq 1$, $0 \leq y2 \leq 1$), and having a second bandgap energy, smaller than the first bandgap energy, and a p-type third semiconductor layer located between the first semiconductor layer and the second semiconductor layer, of $In_{x3}Al_{y3}Ga_{1-x3-y3}N$, wherein $x3=0.04$ and $y3=0.18$, and having a third bandgap energy smaller than the first bandgap energy and larger than the second bandgap energy, wherein the p-type second semiconductor layer is located farther from the active layer than is the p-type first semiconductor layer.

8. The semiconductor light emitting device according to claim 7, wherein the p-type third semiconductor layer has a thickness in a range from 1 nm to 50 nm.

9. The semiconductor light emitting device according to claim 7, wherein the p-type third semiconductor layer has a thickness in a range from 1 nm to 30 nm.

10. The semiconductor light emitting device according to claim 7, wherein the p-type third semiconductor layer has a thickness in a range from 1 nm to 100 nm.

11. The semiconductor light emitting device according to claim 10, wherein $x2=0$; $y2<0.05$, and $0.2-y2>0.15$.

12. The semiconductor light emitting device according to claim 10, wherein the p-type third semiconductor layer is lattice-matched to the GaN substrate.

* * * * *